United States Patent [19]

Hosoda et al.

[11] Patent Number: 5,008,562
[45] Date of Patent: Apr. 16, 1991

[54] APPARATUS FOR GENERATING PULSE-LIKE CONSTANT CURRENT HAVING VARIABLE PULSE WIDTH

[75] Inventors: Takuya Hosoda; Mitsuhiro Morishita; Takashi Tamura, all of Tokyo, Japan

[73] Assignee: Ando Electric Co., Ltd., Tokyo, Japan

[21] Appl. No.: 388,200

[22] Filed: Aug. 1, 1989

[30] Foreign Application Priority Data

Aug. 31, 1988 [JP] Japan .................... 63-218191

[51] Int. Cl.[5] .................... H03K 5/04; H03K 5/05
[52] U.S. Cl. .................... 307/265; 307/263; 307/268; 307/270
[58] Field of Search ............... 307/268, 270, 263, 265, 307/311

[56] References Cited

U.S. PATENT DOCUMENTS

| | | | |
|---|---|---|---|
| 4,031,414 | 6/1977 | Giles et al. | 307/263 |
| 4,362,955 | 12/1982 | Davenport | 307/263 |
| 4,609,832 | 9/1986 | Mehl | 307/270 |
| 4,866,299 | 9/1989 | Kannegundla | 307/270 |

*Primary Examiner*—John Zazworsky
*Attorney, Agent, or Firm*—Seidel, Gonda, Lavorgna & Monaco

[57] ABSTRACT

An apparatus for generating a pulse-like constant current with a variable pulse width for use in evaluating thermal characteristics of a laser diode. The apparatus comprises a first constant current (or voltage) circuit constituted by a high-speed amplifer, a second constant (or voltage) circuit constituted by a low-speed amplifier and connected in parallel with the first constant current circuit, a bias circuit for increasing higher the output voltage of the second constant current circuit than that of the first constant current circuit, a switching circuit for turning on and off the first and second constant current circuits in response to first and second timing signals, respectively, in such a manner that the first timing signal and the second timing signal are simultaneously turned on while the second timing signal is turned off only after the first timing signal has been turned off, and a regulator for changing the width of the output current pulse by varying the on/off durations of the first and second timing signals. For evaluating the thermal characteristics of the laser diode, the pulse-like constant current is applied for excitation and the pulse width of the current is varied to change the light emission characteristics of the diodes, which are measured and compared for making evaluation.

4 Claims, 6 Drawing Sheets

APPARATUS FOR GENERATING PULSE-LIKE CONSTANT CURRENT HAVING VARIABLE PULSE WIDTH

BACKGROUND OF THE INVENTION

The present invention relates generally to an apparatus for generating a pulse-like constant current having a variable pulse width which can be profitably used for evaluating thermal behaviors or characteristics of laser diodes. More particularly, the invention is concerned with an apparatus which includes a first high-speed amplifier and a second low-speed amplifier connected in parallel with each other for generating constant current pulses with variable pulse width or duration by controlling the on/off durations of the first and second amplifiers.

As one of the techniques in which the pulse-like constant current is made use of, there may be mentioned a test for evaluating thermal characteristics or behaviors of the laser diodes.

The laser diode is an element which is susceptible to the influence of heat such that oscillation wavelength thereof is shifted to a region of long wavelengths and/or the oscillation threshold current is increased as the temperature rises, involving decrease in the output laser power as well as in the use life of the laser diode. The temperature rise of the laser diode is generally in proportion to the magnitude of an excitation current applied to the laser diode for light emission and a period during which the excitation current is supplied. Accordingly, in order to ensure a stabilized operation of the laser diode, such a structure is required which can suppress the temperature rise brought about by the current injected for exciting the light emission to a minimum possible level and which can allow the heat generated by the laser diode in the light emitting state to be released externally.

As the method of evaluating the thermal characteristics or behaviors of the laser diode in the operating state, there is known a method of measuring and comparing changes or variations in the light emission characteristics by changing the period for driving or exciting the laser diode by applying selectively a pulse-like current of a short pulse width (duration) and a pulse-like current of a long pulse width to the laser diode.

The present invention is directed to an apparatus for generating a pulse-like constant current to be utilized in evaluation of the thermal characteristics of the laser diodes.

As a prior art pulse-like constant current generating technique, there has been proposed an approach in which a feedback circuit is employed, as is disclosed, for example, in Japanese Patent Application Laid-Open No. 63834/1987 (JP-A-62-63834) (in particular, reference may be made to FIGS. 3 and 4). More specifically, there are provided in the output stage of the pulse-like constant current generator mentioned above a pluralitY of high-speed switching transistors which are connected in parallel. However, the transistors of this sort are generally limited in respect to the permissible collector loss and can operate only with a narrow output pulse width in a region where the duty ratio of the output current is smaller than several percentages, thus giving rise to a problem. Such being the circumstances, when the output current is to be generated with an increased pulse width, a large number of transistors constituting major parts of the output stage of the current generator are employed in a parallel connection. The current generator of such circuit configuration nevertheless suffers from disadvantages that the stray loss is increased, involving instability in operation, not to speak of high expensiveness.

In the followings, the prior art pulse-like current generator will be described in concrete by referring to FIGS. 5, 6 and 7 of the accompanying drawings.

In FIG. 5, a reference numeral 21 denotes an input voltage terminal, 22 denotes a terminal for a timing signal, 23 denotes an analogue switch, 24 to 27 denote amplifiers, respectively, and a numeral 28 denotes a laser diode.

The amplifier 25 is constituted by three transistors connected in parallel. On the other hand, the amplifiers 24, 26 and 27 cooperate to constitute a feedback circuit, whereby a constant current circuit is realized.

Under the timing commanded by the timing signal applied to the terminal 22, the analogue switch 23 is turned on and off, whereby a rectangular pulse current is supplied to the laser diode 28. The output characteristics of the constant current circuit shown in FIG. 5 are illustrated in FIGS. 6 and 7. As can be seen in FIG. 6, the current $I_F$ drops or decreases significantly when the pulse width or duration exceeds 10,000 $\mu$S at the duty ratio of 0.1%, which means that increasing the pulse width beyond a predetermined value renders it no longer possible to derive the constant current output, presenting a problem. On the other hand, the current $I_F$ decreases as a function of the increase in the duty ratio, as is illustrated in FIG. 7. In other words, there exists another problem that a large constant current can not be derived as the output current when the duty ratio is increased.

SUMMARY OF THE INVENTION

An object of the present invention is to eliminate the shortcomings of the prior art pulse-like constant current generating apparatus mentioned above and provide an apparatus for generating a pulse-like constant current with a variable pulse width such that the temporal duration of the output current pulse can be varied to an infinite value by synthesizing output currents or output voltages of a high-speed pulse current amplifier and a low-speed DC current amplifier.

In view of the above and other objects which will be more apparent as description proceeds, there is provided according to an aspect of the invention an apparatus for generating a pulse-like constant current with a variable pulse width, which apparatus comprises a first constant current circuit constituted by a high-speed amplifier, a second constant current circuit constituted by a low-speed amplifier and connected in parallel with the first constant current circuit, a bias circuit for setting higher the output voltage of the second constant current circuit than the output voltage of the first constant current circuit, a first switch for turning on and off the first constant current circuit in response to a first timing signal, a second switch for turning on and off the second constant current circuit in response to a second timing signal, first and second timing signal generators for generating the first timing signal and the second timing signal, respectively, in such a manner that the first timing signal and the second timing signal are simultaneously turned on while the second timing signal is turned off only after the first timing signal has been turned off, the first and second timing signal generator means including means for changing the on/off durations of the first and second timing signals so as to change the widths of the output current pulses.

According to another aspect of the present invention, there is provided an apparatus for generating a pulse-like constant current with a variable pulse width, which apparatus comprises a first constant voltage circuit constituted by a high-speed amplifier, a second constant voltage circuit constituted by a low-speed amplifier and connected in parallel with the first constant voltage circuit, a bias circuit for setting higher the output voltage of the second constant voltage circuit than the output voltage of the first constant voltage circuit, a first switch means for turning on and off the first constant voltage circuit in response to a first timing signal, a second switch means for turning on and off the second constant voltage circuit in response to a second timing signal, first and second timing signal generator means for generating the first timing signal and the second timing signal, respectively, in such a manner that the first timing signal and the second timing signal are simultaneously turned on while the second timing signal is turned off only after the first timing signal has been turned off the first and second timing signal generator means including means for changing the on/off durations of the first and second timing signals so as to change the widths of the output current pulses.

BRIEF DESCRIPTION OF THE DRAWINGS

The invention will become more apparent by reading the following detailed description of the preferred embodiments taken in conjunction with the drawings which are shown by waY of example only, wherein.

DESCRIPTION OF THE PREFERRED EMBODIMENTS

Now, the present invention will be described in conjunction with exemplary embodiments thereof by reference to the accompanying drawings.

Figure 1:
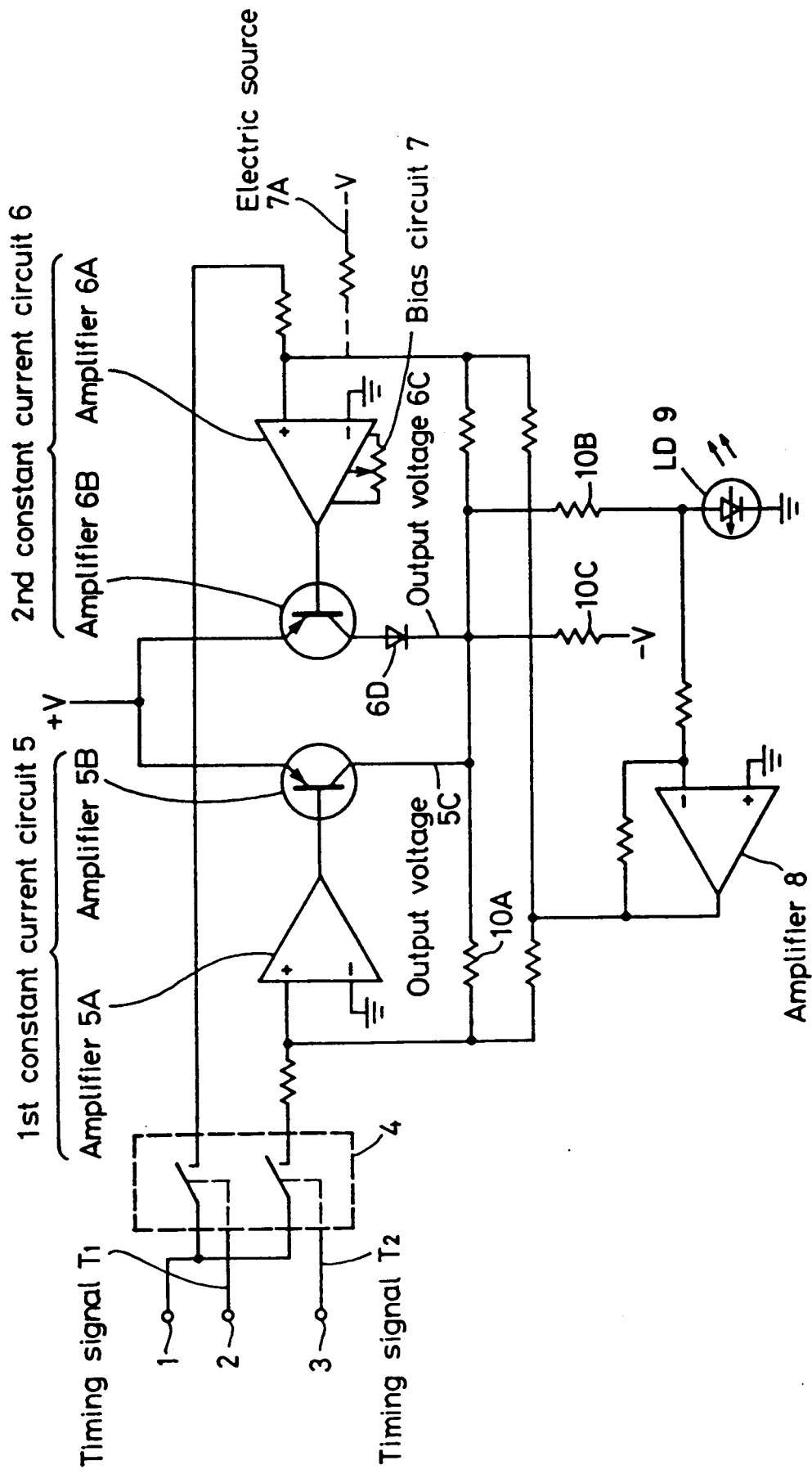
FIG. 1 is a circuit diagram showing a general arrangement of the pulse-like constant current generating apparatus according to an exemplary embodiment of the present invention.

FIG. 1 shows a structure of the pulse-like constant current generating apparatus implemented in the form of a current synthesizing type constant current driver circuit according to a first embodiment of the invention.

In FIG. 1, a reference numeral 1 denotes an input voltage terminal, 2 and 3 denote input terminals for first and second timing signals $T_1$ and $T_2$, respectively, 4 denotes an analogue switch, 7 denotes a bias circuit, 8 denotes an amplifier and 9 denotes a laser diode. A first constant current circuit denoted generally by a numeral 5 is constituted by high-speed amplifiers 5A and 5B and an amplifier 8. Further provided is a second constant current circuit 6 which is constituted by low-speed amplifiers 6A and 6B and the amplifier 8. It will be noted that the constant current circuits 5 and 6 are connected in parallel with each other.

A bias circuit 7 is provided for the purpose of setting the output voltage 6C of the constant current circuit 6 higher than the output voltage 5C of the constant current circuit 5. To this end, the bias circuit 7 may be so configured and connected as to apply such an offset voltage to the amplifier 6A that the output voltage 60 of the amplifier 6B becomes higher about 10 mV than the output voltage 5C of the amplifier 5B. It should however be mentioned that a power supply source 7A may be used in place of the bias circuit 7. In this case, the power supply source 7A is so connected that such a bias voltage is applied to the amplifier 6A that the output voltage 6C of the constant current circuit 6 becomes higher than the output voltage 5C of the constant current circuit 5C. As can be seen in FIG. 1, the amplifier 8 has an inverted output.

In response to the first timing signal $T_1$ applied to the input terminal 2, the analogue switch 4 is operated to switch on and off the constant current circuit 6. Further, the analogue switch 4 responds to the second timing signal $T_2$ supplied through the input terminal 3 by switching on and off the constant current circuit 5.

Parenthetically, the output current of the circuit shown in FIG. 1 has a positive polarity. In order to realize the negative polarity for the output current, the power supply source is connected with the polarities $+V$ and $-V$ being reversed, while the amplifiers 5B and 6B are constituted by NPN-type transistors, respectively, wherein a diode 6D connected to the amplifier 6B is reversed in respect to the current conducting direction.

In operation of the apparatus shown in FIG. 1, a voltage making appearance across a resistor 10B assumes a same voltage waveform as that of the input voltage applied to the input terminal 1.

Figure 2:
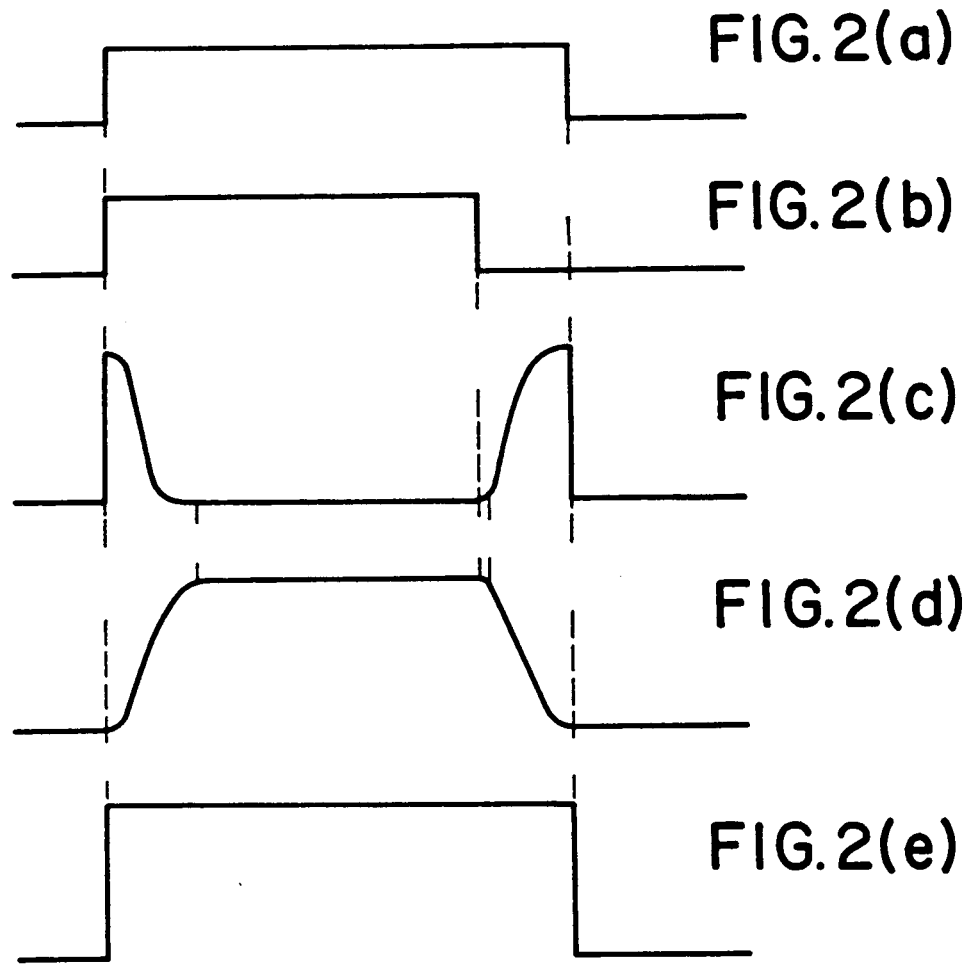
FIG. 2 is a waveform diagram showing timing and waveforms of signals making appearance in the apparatus shown in FIG. 1 for elucidating operation thereof.

FIG. 2 shows waveforms of various signals appearing in the circuit shown in FIG. 1.

More specifically, a waveform of the timing signal $T_2$ is shown at (a) in FIG. 2 with that of the timing signal $T_1$ is shown at (b). A waveform of the output current of the constant current circuit 5 is shown at (c) in FIG. 2 while that of the constant current circuit 6 is shown at (d). A synthesized output current applied to the laser diode 9 is shown at (e) in FIG. 2 As can be seen from comparison of the waveforms shown at (a) and (b) in FIG. 2, the timing signal $T_1$ is switched on simultaneously with the turn-on of the timing signal $T_2$. On the other hand, the timing signal $T_2$ is switched off only after the timing signal $T_1$ has been switched off in precedence. By varying the duration or period of the timing signal $T_1$ differently from that of the timing signal $T_2$ in this manner, the pulse duration of the synthesized output pulse-like current can be changed correspondingly.

Next, actions of the output currents of the constant current circuits 5 and 6 will be explained by reference to the waveform diagrams (c) and (d) shown in FIG. 2.

When the timing signals $T_1$ and $T_2$ are both applied simultaneously, the constant current circuit 5 which is constituted by the high-speed amplifier as mentioned hereinbefore is immediately turned on, as can be seen at the left-hand side of the waveform (c) shown in FIG. 2. On the other hand, the constant current circuit 6 constituted by a low-speed amplifier remains in the off state even after the constant current circuit 5 has been switched to the conducting state (on-state).

In this conjunction, it should be recalled that the output voltage 6C cf the constant current circuit 6 is set higher than the output voltage 5C of the constant current circuit 5 by the bias circuit 7. Accordingly, upon start of the amplifying operation of the amplifier constituting the constant current circuit 6, the output voltage of the latter rises up progressively, wherein upon attainment of the operating point of the constant current circuit 6, the output voltage 6C thereof increases forcibly the output voltage 5C of the constant current circuit 5 by an amount corresponding to the magnitude of the offset voltage.

As the result, a difference voltage having a positive (plus) polarity relative to the output of the constant current circuit 5 is negatively fed back by way of a resistor 10A to thereby switch off the amplifier 5B, which in turn results in a rapid decrease of the output voltage 5C of the constant current circuit 5.

The time taken for the constant current circuit 6 to be turned on, i.e. the rise-up time shown in the form of the leading edge at (d) in FIG. 2 is in a range of 20 $\mu S$ to 30 $\mu S$.

When the timing signal $T_1$ shown at (b) in FIG. 2 is turned off, the output of the constant current circuit 6 starts to fall, as can be seen from the trailing edge shown at (d) in FIG. 2. At this time point, the constant current circuit 5 which has been in the off-state until then due to application of the offset voltage derived from the output of the constant current circuit 6 starts to operate, whereupon the output voltage is again produced by the constant current circuit 5, as indicated by a rise-up edge shown at the right-hand side of the waveform (c) in FIG. 2. Upon turn-off of the timing signal $T_2$ shown at (a) in FIG. 2, the output of the constant current circuit 5 falls rapidly, as indicated by a steeply falling trail edge shown at the right-hand side of the waveform (c).

Thus, the output current of the pulse-like constant current generating apparatus shown in FIG. 2 at (e) is synthesized in a manner described as follows.

The leading edge of the output current waveform shown at (e) rises up rapidly due to the contribution of the output of the constant current circuit 5. The intermediate portion (i.e. pulse duration) of the waveform (e) remains flat at a constant level due to the output of the low-speed constant current circuit 6. The trailing edge of the output current (e) falls rapidly due to the output of the constant current circuit 5.

A resistor 10C shown in FIG. 1 serves as a bleeder current setting resistor for improving the falling characteristics of the pulse-like output current. To this end, other element such as, for example, a constant current diode or transistor may be provided in addition.

Figure 3:
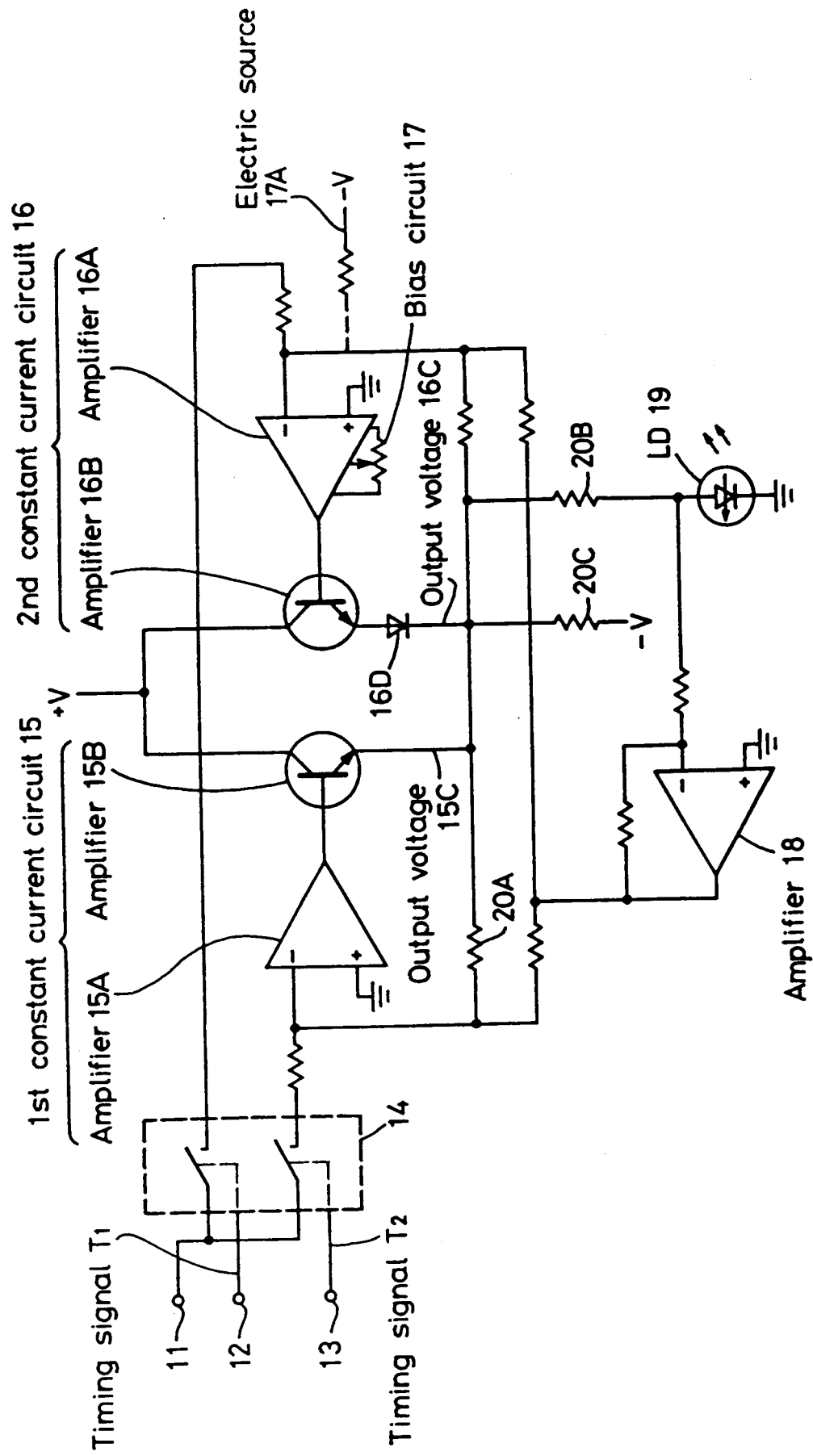
FIG. 3 is a circuit diagram showing a circuit configuration of the pulse-like constant current generating apparatus according to another embodiment of the invention.
Figure 4A:
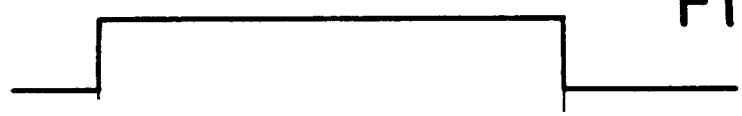
FIG. 4 is a waveform diagram for illustrating operation of the apparatus shown in FIG. 3.
Figure 4B:
Figure 4C:
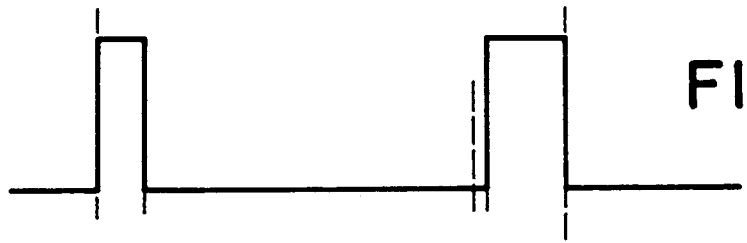
Figure 4D:
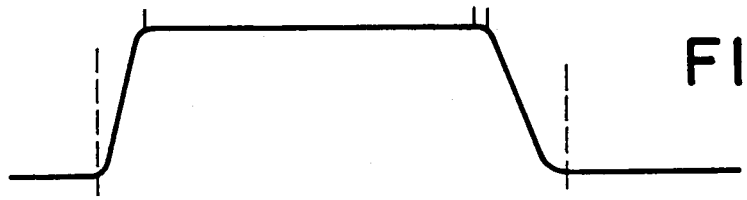
Figure 4E:
Figure 5:
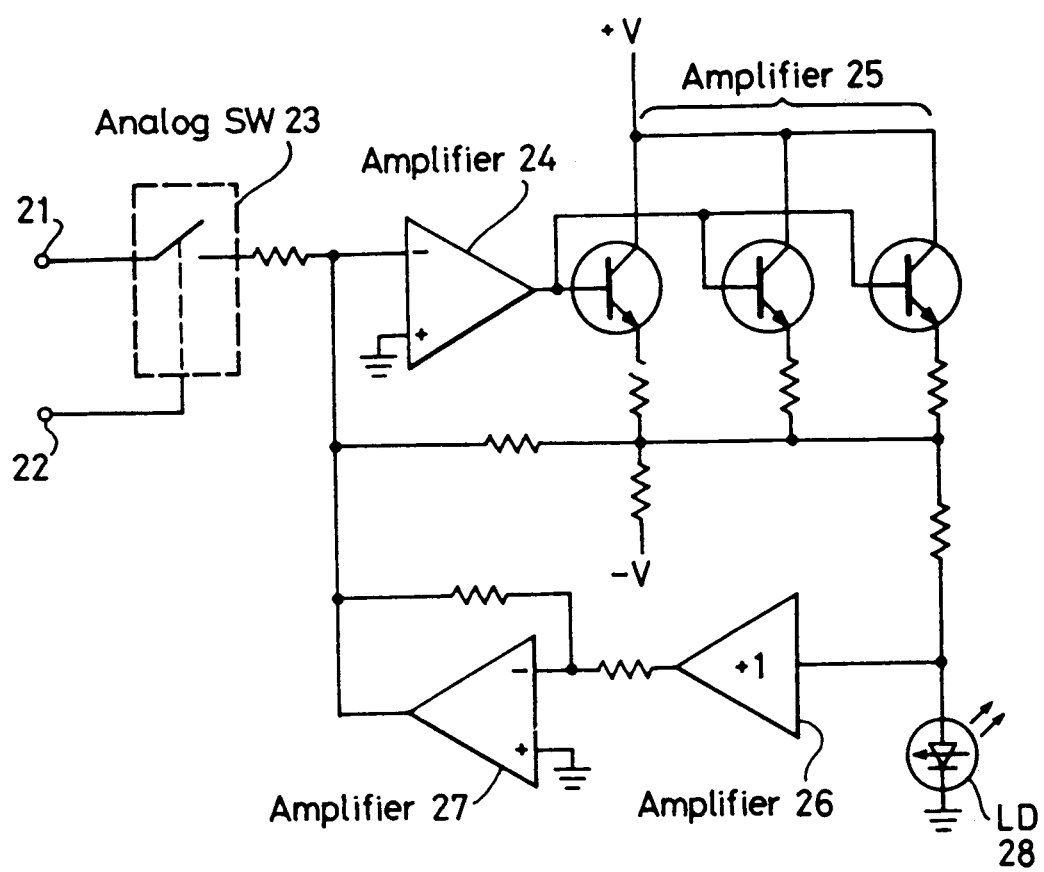
FIG. 5 is a circuit diagram showing a structure of a prior art pulse-like constant current generating circuit.
Figure 6:
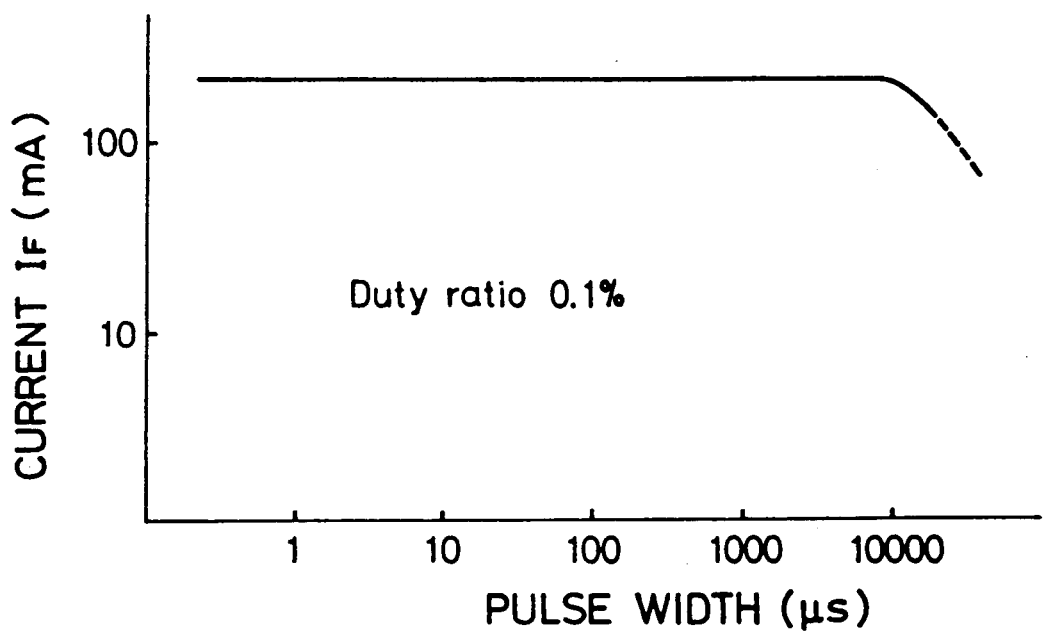
FIGS. 6 and 7 are views for illustrating graphically the output characteristics of the pulse-like current generating circuit shown in FIG. 5.
Figure 7:
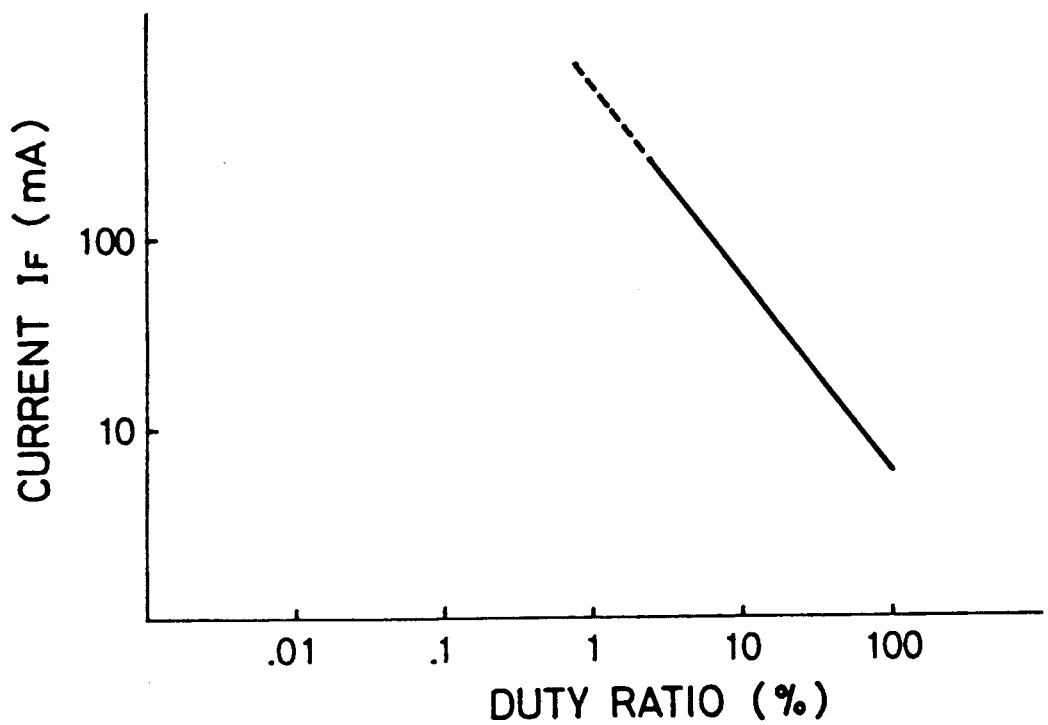

FIG. 3 shows another embodiment of the pulse-like constant current generating apparatus implemented in the form of a voltage synthesizing type constant current driver according to another embodiment of the invention. In this figure, parts denoted by reference numerals 11 to 19 are equivalent to those designated by 1 to 9 in FIG. 1, respectively. Accordingly, repeated description of these parts will be unnecessary. A reference numeral 15 denotes a first constant voltage circuit constituted by high-speed amplifiers 15A and 15B. A second constant voltage circuit 16 is constituted by low-speed amplifiers 16A and 16B. The constant voltage circuit 15 and the amplifier 18 cooperate to constitutes a constant current circuit, while the constant voltage circuit 16 and the amplifier 18 constitute another constant current circuit.

A bias circuit 17 is so configured and connected that the output voltage 16C of the constant voltage circuit 16 is higher than the output voltage 15C of the constant voltage circuit 15. The constant voltage circuits 15 and 16 are connected in parallel in respect to the outputs thereof.

In contrast to the the amplifiers 5B and 6B which are implemented by using the PNP-type transistors, the amplifiers 15B and 16B are constituted by NPN-type transistors, respectively, to realize the voltage synthesizing type pulse current generator.

Parenthetically, it should be mentioned that when the transistor constituting the amplifier 16B is capable of withstanding the base-emitter backward voltage as applied by the outputs of circuits 15 and 16, the diode 16D may be omitted.

Operation of the variable width pulse current generator shown in FIG. 3 will be apparent from the waveform diagrams shown in FIG. 4 in the light of the foregoing description of the pulse-like current generator shown in FIG. 1. In FIG. 4, the waveforms (a) to (e) shown in FIG. 4 correspond to the waveforms (a) to (e) shown in FIG. 2. respectively. It should however be understood that the pulse-like constant current generator shown in FIG. 3 operates on the basis of the concept of voltage synthesization.

In the pulse-like current generators shown in FIG. 1 and 3, the current capacity can be increased in such a manner as mentioned below.

A plurality of the amplifiers 5B may be connected in parallel with a plurality of the amplifiers 6B being connected in parallel to thereby increase the current capacity. Similarly, a plurality of the amplifiers 15B may be connected in parallel with a plurality of the amplifiers 16B being connected in parallel.

As will be appreciated form the foregoing description, there has now been provided according to the invention an apparatus for generating a pulse-like constant current of which pulse width or duration can be varied up to infinity by virtue of synthesization of the output currents or voltages of a high-speed pulse current amplifier and a low-speed DC current amplifier.

By using the pulse-like constant current generating apparatus according to the present invention, it is possible to evaluate conveniently and inexpensively the thermal behaviors or characteristics of the laser diodes bY applying the pulse-like constant current thereto and varying the pulse width of the current to thereby change the light emission characteristics of the laser diode, which are subsequently measured and compared for the evaluation.

The many features and advantages of the invention are apparent from the foregoing detailed description and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, and accordingly, all suitable modifications and equivalents may be resorted to, falling within the scope of the invention.

What is claimed is:

1. An Apparatus for generating a pulse-like constant current with a variable pulse width, comprising:

a first constant current circuit constituted by a high-speed amplifier;

a second constant current circuit constituted by a low-speed amplifier and connected in parallel with said first constant current circuit;

each of said first and second constant current circuits providing an output current and an output voltage;

a bias circuit for setting the output voltage of said second constant current circuit higher than the output voltage of said first constant current circuit;

first switching means for turning on and off said first constant current circuit in response to a first timing signal;

second switching means for turning on and off said second constant circuit in response to a second timing signal;

first and second timing signal generating means for generating said first timing signal and said second timing signal, respectively, in such a manner that said first timing signal and said second timing signal are simultaneously turned on while said second timing signal is turned off after said first timing signal is turned off;

said first and second timing signal generator means including means for changing the on/off durations of the first and second timing signals so as to change the widths of the output current pulses.

2. A pulse-like constant current generating apparatus according to claim 1, wherein said first constant current circuit is constituted by a high-speed pulse current amplifier, while said second constant current circuit is constituted by a low-speed DC current amplifier.

3. An apparatus for generating a pulse-like constant current with a variable pulse width, comprising:

a first constant voltage circuit constituted by a high-speed amplifier;

a second constant voltage circuit constituted by a low-speed amplifier and connected in parallel with said first constant voltage circuit;

each of said first and second constant current circuits providing an output current and an output voltage;

a bias circuit for setting the output voltage of said second constant voltage circuit higher than the output voltage of said first constant voltage circuit;

first switching means for turning on and off said first constant voltage circuit in response to a first timing signal;

second switching means for turning on and off said second constant voltage circuit in response to a second timing signal;

first and second timing signal generating means for generating said first timing signal and said second timing signal, respectively, in such a manner that said first timing signal and said second timing signal are simultaneously turned on while said second timing signal is turned off after said first timing signal is turned off;

said first and second timing signal generator means including means for changing the on/off durations of the first and second timing signals so as to change the widths of the output current pulses.

4. A pulse-like constant current generating apparatus according to claim 3, wherein said first constant voltage circuit is constituted by a high-speed pulse current amplifier, while said second constant voltage circuit is constituted by a low-speed DC current amplifier.

* * * * *